US006928878B1

(12) United States Patent
Eriksen et al.

(10) Patent No.: US 6,928,878 B1
(45) Date of Patent: Aug. 16, 2005

(54) PRESSURE SENSOR

(75) Inventors: Odd Harald Steen Eriksen, Brooklyn Park, MN (US); Shuwen Guo, Lakeville, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 10/952,310

(22) Filed: Sep. 28, 2004

(51) Int. Cl.$^7$ ................................................ G01L 9/16
(52) U.S. Cl. ........................................................ 73/724
(58) Field of Search .......................... 73/706, 715–727, 73/754; 257/301–306, 522, 544, 751–788

(56) References Cited

U.S. PATENT DOCUMENTS

| | | | |
|---|---|---|---|
| 4,730,496 A | | 3/1988 | Knecht et al. |
| 4,777,826 A | | 10/1988 | Rud, Jr. et al. |
| 4,799,088 A | * | 1/1989 | Hiyamizu et al. ........... 257/194 |
| 4,922,310 A | * | 5/1990 | Colquhoun .................. 257/282 |
| 5,365,078 A | * | 11/1994 | Hayashi et al. ................ 257/24 |
| 5,515,732 A | | 5/1996 | Willcox et al. |
| 5,677,553 A | | 10/1997 | Yamamoto et al. |
| 6,611,002 B2 | | 8/2003 | Weeks et al. |
| 6,617,060 B2 | | 9/2003 | Weeks, Jr. et al. |
| 6,649,287 B2 | | 11/2003 | Weeks, Jr. et al. |
| 2003/0119220 A1 | | 6/2003 | Mlcak et al. |

OTHER PUBLICATIONS

Statement by Applicant with Attachment A.
Eickhoff, M. et al., "Novel Sensor Applications of group-III nitrides," Materials Research Society Symp. Proc., vol. 693, pp. 781-792 (2002).
Gaska, R. et al., "Piezoresistive effect in metal-semiconductor-metal structures on p-type GaN," Applied Physics Letters, vol. 76, No. 26, pp. 3956-3958 (Jun. 26, 2000).
Gaska, R. et al., "The influence of the deformation on the two-dimensional electron gas density in GaN-AlGaN heterostructures," Applied Physics Letters, vol. 72, No. 1, pp. 64-66 (Jan. 5, 1998).
Vescan, A. et al., "MBE grown AlGaN/GaN MODFETs with high breakdown voltage," International MBE Conference (1998); Journal of Crystal Growth (1999).
Akasaki, I., "The Evolution of Nitride Semiconductors," Materials Research Society Symp. Proc., vol. 482, pp. 3-14 (1998).
Hickman, R. et al., "Uniformity and High Temperature Performance of X-Band Nitride Power HEMTs Fabricated from 2-inch Epitaxy," Solid State Electronics, vol. 42, Issue 12, pp. 2183-2185 (Dec. 1998).
Gaska, R. et al., "Piezoresistive effect in GaN-AlN-GaN structures," Applied Physics Letters, (1997).
Bykhovski, A. D. et al., "Piezoresistive effect in wurtzite n-type GaN," Applied Physics Letters, vol. 68, No. 6, pp. 818-819 (Feb. 5, 1996).

* cited by examiner

*Primary Examiner*—William Oen
(74) *Attorney, Agent, or Firm*—Thompson Hine LLP

(57) ABSTRACT

A pressure sensor including a movable component that is configured to move when the pressure sensor is exposed to differential pressure thereacross, and a pressure sensing component located on the movable component. The pressure sensing component includes an electrically conductive electron gas which changes its electrical resistance thereacross upon movement of the movable component. The pressure sensor is configured such that leads can be coupled to the pressure sensing component and the pressure sensing component can output a signal via the leads, the signal being related to a pressure to which the pressure sensor is exposed.

23 Claims, 6 Drawing Sheets

PRESSURE SENSOR

The present invention is directed to a pressure sensor, and more particularly, to a heat resistant pressure sensor.

BACKGROUND

Pressure sensors are widely used to sense the pressure of various fluids. Many existing pressure sensors utilize a flexible diaphragm having a piezoresistor located thereon such that flexure of the diaphragm causes a change in the resistance of the piezoresistor. However, many piezoresistive materials are unable to withstand high temperatures. The limited temperature range of such piezoresistive materials limits the environments in which the pressure sensor can be used and also limits the processing or manufacturing steps (i.e. when manufacturing the sensor) which may take place after the piezoresistive materials are deposited. Accordingly, there is a need for a pressure sensor utilizing improved, heat resistant sensing materials.

SUMMARY

In one embodiment, the present invention is a pressure sensor utilizing heat resistant sensing materials. In particular, the pressure sensor utilizes two piezoelectric materials, one of which is doped to form an electron donor material, to create an electrically conductive electron gas at the interface of the piezoelectric material and the electron donor material. The materials selected for the electron donor material and piezoelectric material are preferably heat resistant to provide a heat resistant pressure sensor.

In one embodiment the invention is a pressure sensor including a movable component that is configured to move when the pressure sensor is exposed to differential pressure thereacross, and a pressure sensing component located on the movable component. The pressure sensing component includes an electrically conductive electron gas which changes its electrical resistance thereacross upon movement of the movable component. The pressure sensor is configured such that leads can be coupled to the pressure sensing component and the pressure sensing component can output a signal via the leads, the signal being related to a pressure to which the pressure sensor is exposed.

Other objects and advantages of the present invention will be apparent from the following description and the accompanying drawings.

DETAILED DESCRIPTION

Figure 1:
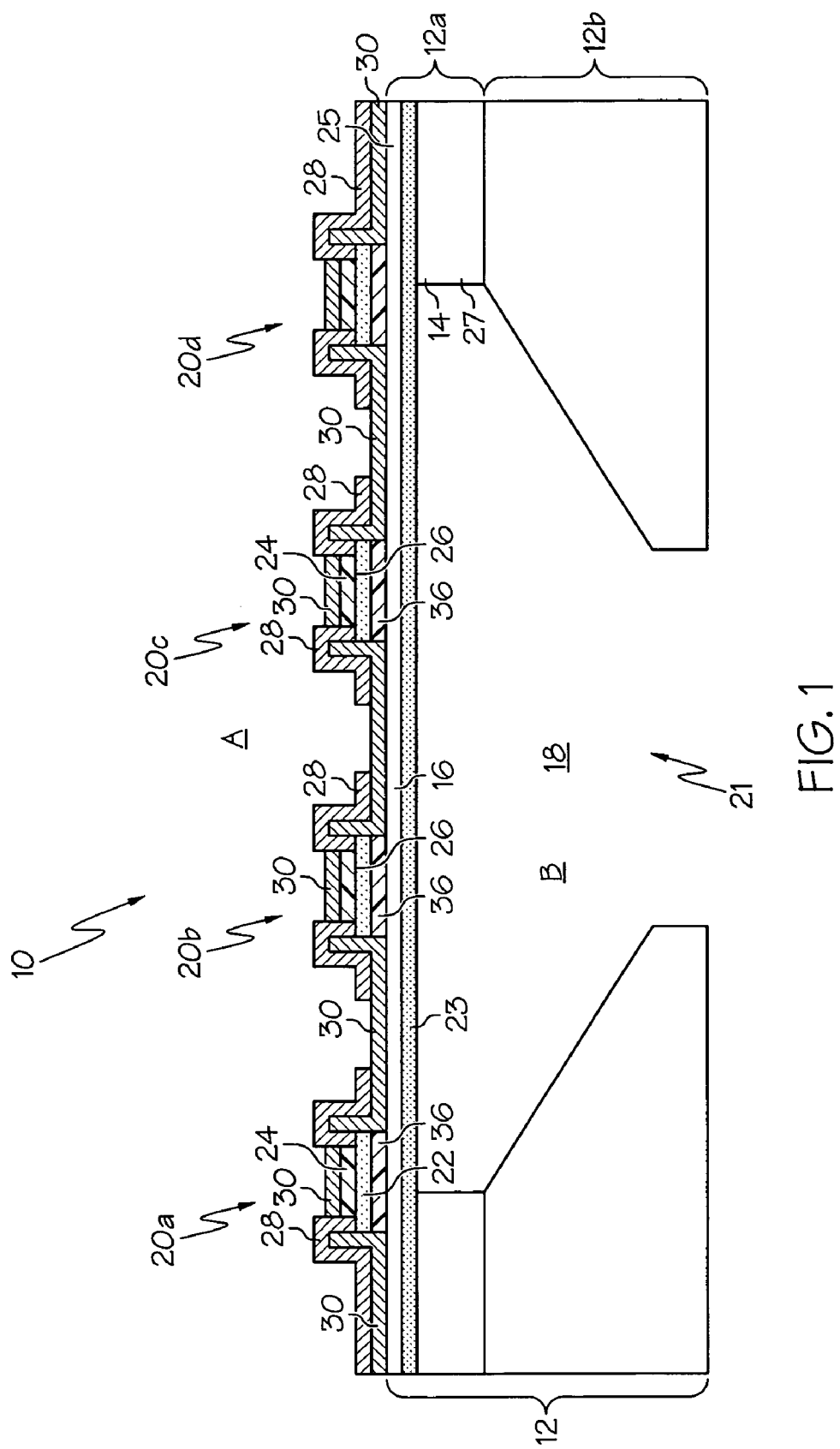
FIG. 1 is a side cross section of one embodiment of the pressure sensor of the present invention.

As shown in FIG. 1, the pressure sensor 10 of the present invention includes substrate 12 having an upper substrate portion 12a and a lower substrate portion 12b. The substrate 12 may be made of a variety of materials, including but not limited to silicon carbide, sapphire, silicon nitride, semiconductor materials such as silicon, ceramics such as aluminum nitride, a combination of these materials or nearly any other material which can be machined or formed into the desired shape. The upper substrate portion 12a includes a relatively thick base portion 14 and a relatively thin diaphragm or movable component 16 extending across a cavity 18 formed in the upper substrate portion 12a and in the lower substrate portion 12b. The base portion 14 is relatively stiff and remains fixed relative to the diaphragm 16 during any flexure of the diaphragm 16.

The diaphragm 16 is relatively thin and flexible such that the diaphragm 16 can flex upwardly or downwardly from its position shown in FIG. 1 when the diaphragm 16 is stressed or exposed to a differential pressure. The diaphragm 16 can have a variety of thicknesses to provide the desired flexibility characteristics. In one embodiment, the diaphragm 16 is relatively thin and has a thickness less than about 500 microns, or more preferably less than about 300 microns, or most preferably less than about 100 microns. In another embodiment the diaphragm 16 is relatively thick and has a thickness greater than about 500 microns. The diaphragm 16 may be generally square in top view although the diaphragm 16 can have a variety of other shapes, including but not limited to circular in top view, rectangular in top view or various other shapes. The lower substrate portion 12b includes a port 21 in its bottom surface which communicates with the cavity 18. The port 21 is preferably circular but may be square or rectangular or any of a variety of other shape conveniently machined or etched in the lower surface of the lower substrate portion 12b.

The pressure sensor 10 includes at least one pressure sensing component 20 located on the diaphragm 16 (with FIG. 1 illustrating four pressure sensing components 20a, 20b, 20c, 20d). It should be understood that when a component or layer is referred to as being located "on" or "above" another component, layer or substrate (such as a pressure sensing component 20 being located on the diaphragm 16), this component or layer may not necessarily be located directly on the other component, layer or substrate, and intervening components, layers or materials could be present. Furthermore, when a component or layer is referred to as being located "on" or "above" another component, layer or substrate, that component or layer may either partially or fully cover the other component, layer or substrate.

In the embodiment shown in FIG. 1, four pressure sensing components 20a, 20b, 20c, 20d are utilized. The diaphragm 16 supports the pressure sensing components 20a, 20b, 20c, 20d and spaces the pressure sensing components away from the cavity 18.

Figure 2:
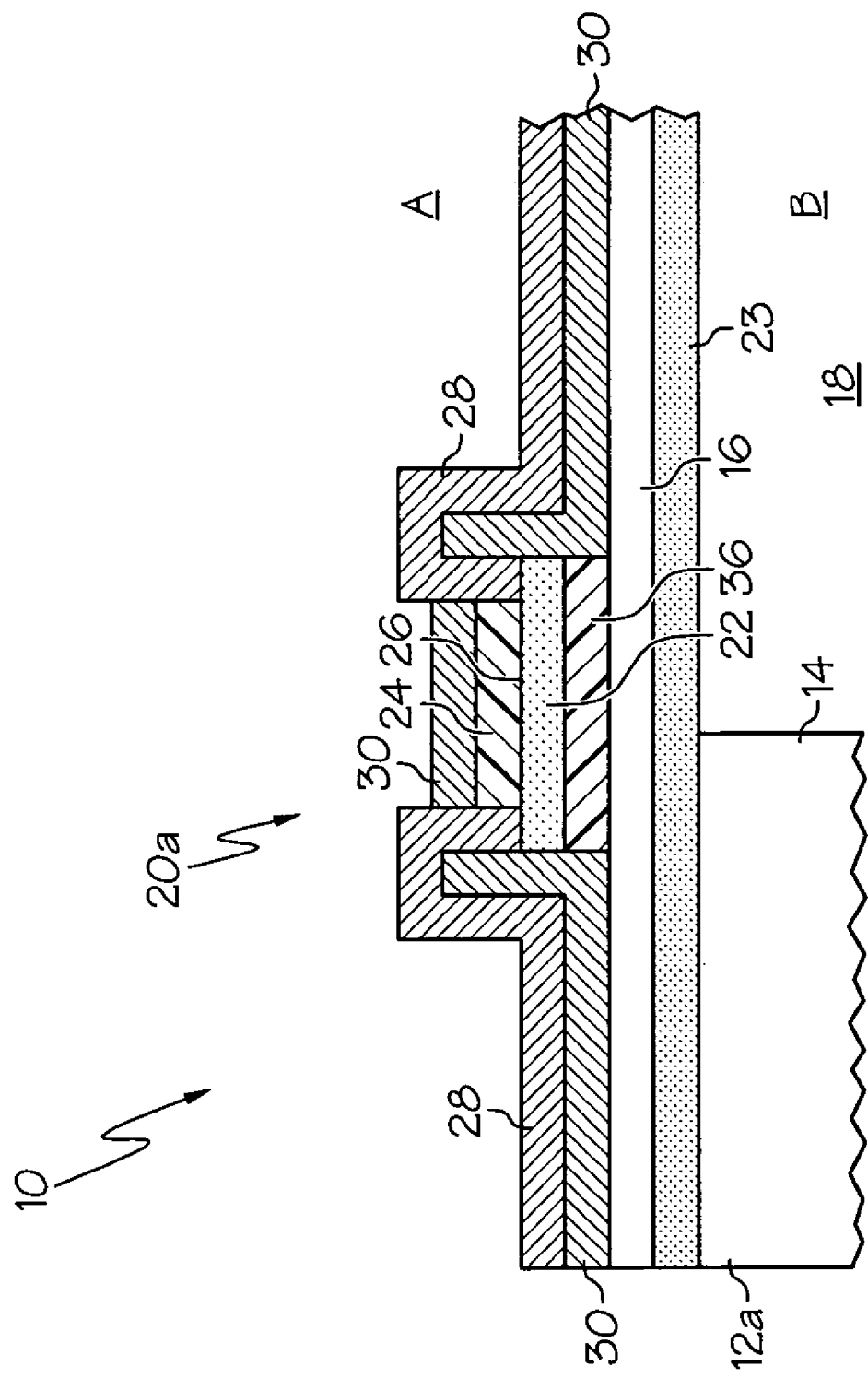
FIG. 2 is a detail view of a pressure sensing component of the pressure sensor of FIG. 1.

FIG. 2 is a detail view of pressure sensing component 20a, with pressure sensing components 20b, 20c and 20d having an identical configuration. Pressure sensor 20a includes a layer of piezoelectric material 22 located on the diaphragm 16 and a layer of electron donor material 24 located on the piezoelectric material 22. The piezoelectric material 22 and electron donor material 24 are located adjacent to each other and are in intimate contact, defining an interface 26 therebetween.

The layer of piezoelectric material 22 is a standard piezoelectric material in which an electric polarity is induced when the material is stressed. The piezoelectric material 22 is preferably gallium nitride (GaN), although as will be described in greater detail below, the piezoelectric material 22 could be made of a variety of other materials including but not limited to GaAs, InGaAs, or InP. In a preferred embodiment the piezoelectric material 22 has a thickness greater than about 0.5 microns, and in a more preferred embodiment has a thickness greater than about 1 micron, and in a most preferred embodiment has a thickness between about 0.5 microns and about 10 microns.

The electron donor material 24 is a layer of material having free electrons; that is, a material having electrons in addition to the normal valence electrons of the material. The electron donor material 24 is preferably a piezoelectric material that is doped to provide additional free electrons, although the electron donor material 24 need not necessarily be doped. The electron donor material 24 is preferably aluminum gallium nitride (AlGaN), although as will be described below, the electron donor material 24 could be made of a variety of materials, including but not limited to AlGaAs or InAlAs. In a preferred embodiment the electron donor material 24 has a thickness between about 200 Angstroms and about 500 Angstroms.

In the embodiment illustrated in FIGS. 1 and 2, the piezoelectric material 22 is located between the electron donor material 24 and the diaphragm 16. However, if desired the electron donor material 24 may be located closer to the diaphragm 16 such that the electron donor material 24 is located between the diaphragm 16 and piezoelectric material 22.

Due to the inherent nature of the piezoelectric layer 22 and the electron donor material 24, those materials 22, 24 establish a two dimensional electron gas ("2DEG") at their interface 26. In particular, both the piezoelectric layer 22 and the electron donor material 24 have the same lattice structure (i.e. a hexagonal lattice structure when the piezoelectric material 22 is gallium nitride and the electron donor material 24 is aluminum gallium nitride). The lattice structures of the piezoelectric layer 22 and the electron donor material 24 are of the same basic (hexagonal) shape, but of different lattice sizes. Thus, at the interface 26 of the piezoelectric layer 22 and the electron donor layer 24, the lattice structures of the electron donor layer 24 adjusts (i.e. either stretches or compresses) to match the lattice structure of the piezoelectric layer 22. This adjustment in lattice structure at the interface 26 causes the lattice structure of the electron donor layer 26 to be adjusted through its entire thickness. When in this condition, the electron donor layer 24 is in a pseudomorphic state wherein the lattice structure of the entire electron donor layer 24 is adjusted or forced to move beyond its normal state. The electron donor material 24 should have a relatively small thickness (i.e. less than about 500 Angstroms) so that the electron donor layer 24 is placed in its strained pseudomorphic condition throughout its entire thickness when deposited on the piezoelectric material 22.

When the lattice structure of the electron donor layer 24 is in its pseudomorphic state, the lattice structure of the electron donor layer 24 is strained. As is well known, when a piezoelectric material (such as the electron donor material 24) is strained, each individual lattice unit cell in the piezoelectric material creates a dipole moment such that a polarization field across the material 24 as a whole is created. Thus, the permanent strain in the electron donor layer 24 creates a permanent polarization field which drives the free electrons of the electron donor layer 24 to the interface 26. In other words, the electron donor material, 24, by virtue of its piezoelectrically induced charge density and its free electrons, provides electrons to the interface 26.

In this manner the piezoelectric material 22 and electron donor material 24 cooperate to generate the electron gas at the interface 26. The electron gas is essentially a thin (i.e. less than about 50 Angstroms) layer of electrons that migrate to the interface 26. This electron gas is electrically conductive, and is a layer of free flowing electrons that are not bound to any particular nucleus but are retained at or around the interface 26 by electrical forces.

A pair of electrically conductive (i.e., metal) contacts 28 are located at either side or end of each pressure sensing component 20 and are electrically coupled to the electron gas at the interface 26. Each of the contacts 28 can be coupled to a controller, processor, computer, CPU or the like (together, a "processor," not shown) by wires, leads or the like such that the processor can apply a potential across each pressure sensing component 20 to thereby cause a current to flow in each pressure sensing component 20. When a voltage is applied across each pressure sensing component 20, a current flows thereacross by virtue of the electron gas present at the interface 26.

In operation, the pressure sensor 10 is immersed in a fluid whose pressure is to be sensed such that the fluid to be sensed is located on the top side A of the pressure sensor 10. The pressure in the cavity 18 may be set at a predetermined level to provide a reference pressure (or a vacuum) by sealing the port 21 (by means not shown) to maintain the reference pressure in the cavity 18. Alternately, if a differential pressure is desired to be measured between fluids on the top and bottom sides, A and B respectively, of the sensor 10, a first fluid is introduced onto the top side A of the sensor 10 and a second fluid is introduced into the side B and into the cavity 18 via the port 21.

Differential pressure across the diaphragm 16 causes the diaphragm 16 to flex upwardly or downwardly. The flexure of the diaphragm 16 strains the pressure sensing components 20 which alters the strain in the electron donor material 24 and modulates the number of electrons donated to the electron gas by the electron donor material 24. For example, when the diaphragm 16 is moved in a first direction such that a strain sensing component 20 is compressed, such compression varies the electron mobility (i.e. the number of available free electrons and their ability to carry a current) of the electron gas. The change in electron mobility in turn varies the conductivity of the electron gas. In contrast, movement of the diaphragm 16 in an opposite direction places the pressure sensing component 20 in tension and varies the conductivity of the electron gas in an opposite manner to that caused by compression. Thus, an applied strain changes the band structure of the electron donor layer 24 and the sheet concentration of the electron gas, therefore modifying its conductivity/resistance.

The change in current flow across the pressure sensing component 20 is proportional to the deflection of the diaphragm 16. Thus, the deflection of the diaphragm 16 can be measured by detecting the current flow across the pressure sensing components 20 for a given voltage or electrical potential when the diaphragm 16 is not deflected, detecting the current flow across the pressure sensing component 20 for the given voltage when the diaphragm 16 is deflected, and comparing the two measured current flows. The processor can then determine the deflection of the diaphragm 16 and calculate the measured pressure by formulas and/or lookup tables and the like.

The electrical potential applied across the length of the pressure sensing component 20 causes the electrons donated by the electron donor material 24 to migrate lengthwise along the interface 26. In this sense, each pressure sensing component 20 could be considered to be a high electron mobility transistor ("HEMT") providing a current flow analogous to the current in a metal oxide semiconductor field effect transistor ("MOSFET"). The piezoelectric material 22 and electron donor material 24 are analogous to a MOSFET gate electrode applied at the center of the field of electrons to modulate the current flow across the pressure sensing components 20. Thus, the pressure sensing components 20 are strain gages that operate as high electron mobility transistors, and the electron flow thereacross is modulated by a change in the electron density at the interface 26.

Figures 3, 3A:
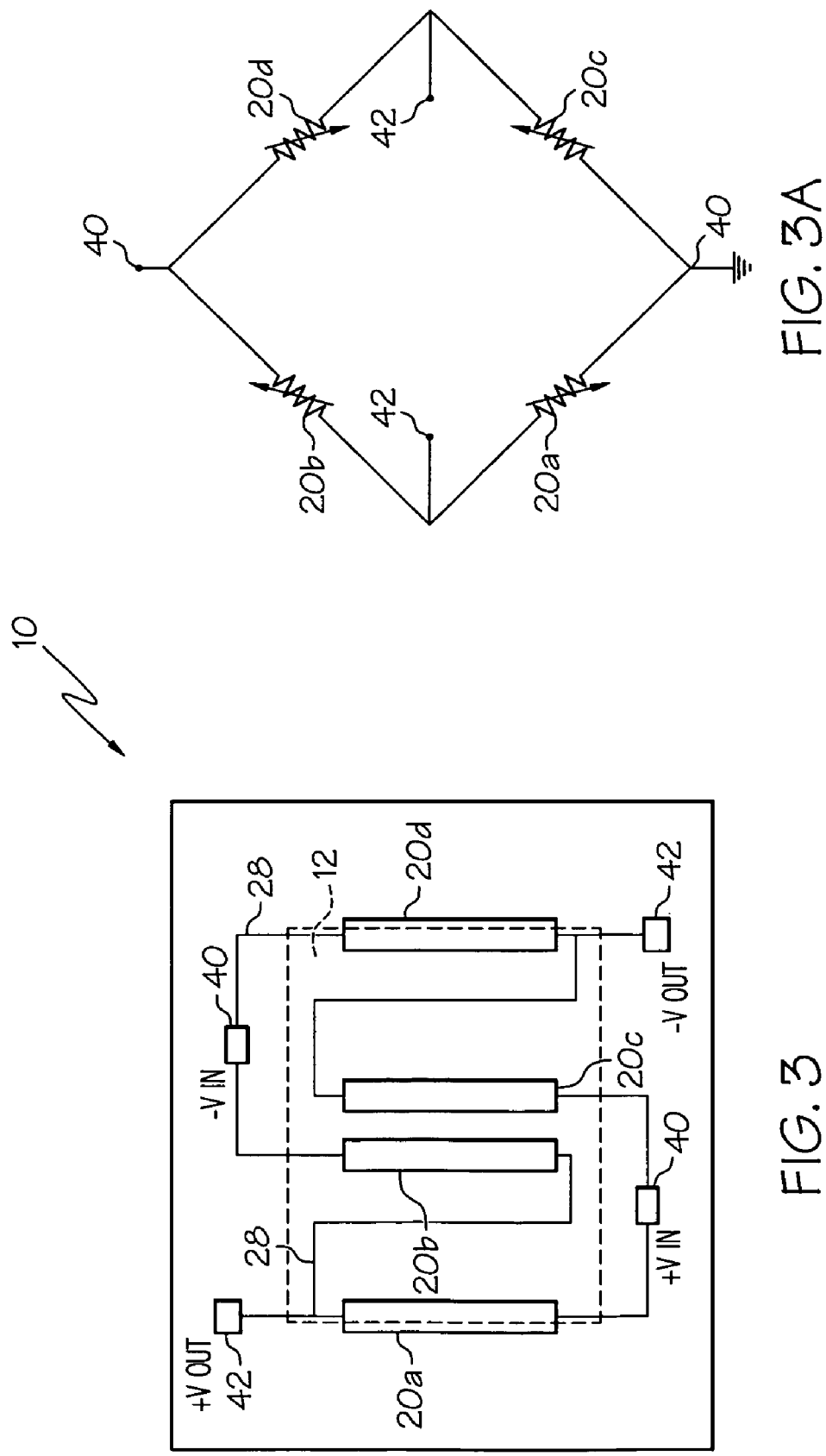
FIG. 3 is a top view of the pressure sensor of FIG. 1, illustrating a Wheatstone bridge configuration.
FIG. 3A is a schematic representation of the pressure sensor of FIG. 3.

As shown in FIGS. 3 and 3A, the pressure sensing components 20a, 20b, 20c, 20d are preferably arranged in Wheatstone bridge configuration on the diaphragm 16. An input voltage is applied across the input voltage terminals 40, and an output voltage is measured across the output voltage terminals 42. The two inner sensing components 20b, 20c should be located at or near the center of the diaphragm 16, and the two outer sensing components 20a, 20d should be located adjacent to the outer edges of the diaphragm 16. In this manner upon movement of the diaphragm 16 the two outer sensing components 20a, 20d experience a tensile or compressive force that is opposite to the tensile or compressive forces of the two inner sensing components 20b, 20c.

When the diaphragm 16 is deflected the resistance of the two inner sensing components 20b, 20c increases or decreases, and the resistance of the two outer sensing components 20a, 20d increases or decreases in an opposite manner than the charge of the inner sensing components 20b, 20c (illustrated in one scenario by the arrows of FIG. 3A). The Wheatstone bridge configuration shown in FIGS. 3 and 3A thereby provides an increased voltage differential across the output voltage terminals 42 to thereby increase the sensitivity of the sensor 10. In particular, the Wheatstone bridge shown in FIGS. 3A and 3B may take the form of the Wheatstone bridge configuration shown in U.S. Pat. No. 5,777,826 to Rud, Jr. et al., the entire contents of which are hereby incorporated by reference.

Rather than having the linear shape shown in FIGS. 1–3, each sensing component 20a, 20b, 20c, 20d may be formed in a serpentine shape in the well-known manner for strain sensors. The serpentine shape increases the sensitivity of the pressure sensing components 20 while minimizing the space required for the pressure sensing components 20. The serpentine shape also allows the effective length of the sensing components 20 to be easily adjusted (i.e. by bypassing certain turns of the serpentine shape) to provide a specific resistance value for each sensing component 20. Such a serpentine shape and its function is shown in, for example, U.S. Pat. No. 5,777,826 to Rud, Jr.

The piezoelectric material 22 and electron donor material 24 should be relatively robust, i.e., sufficiently robust that the diaphragm 16 can flex to a degree that causes significant stress in the pressure sensing components 20 without causing the pressure sensing component 20 to crack. For example, the pressure sensing structure 10 should be able to accommodate a pressure which generates a stress in pressure sensing components 20 of at least about 10 kPa, or further preferably at least about 100 kPa, or most preferably at least about 100 Mpa without causing cracking in the piezoelectric material 22 and/or electron donor material 24. The piezoelectric material 22 and electron donor material 24 should be free of cracks in normal operation. The piezoelectric material 22 and electron donor material 24 (and the pressure sensing component as a whole 20) preferably have a resistivity, in an unstressed condition, of less than about 30 ohm-centimeters, although this resistivity may be varied if desired.

As shown in FIG. 1, the upper exposed portions of the substrate 12 and pressure sensing components 20 are coated with a passivation layer 30, such as silicon nitride, aluminum oxide, or other insulating dielectric materials which seal and protect the sensor 10. The passivation layer 30 is quite thin (i.e. having a thickness between about 3000 Angstroms and about 8000 Angstroms) and therefore is sufficiently flexible so as to not significantly affect the flexural characteristics of the diaphragm 16.

In the preferred embodiment, the piezoelectric material 22 is gallium nitride (GaN) and the electron donor material 24 is N-doped aluminum gallium nitride (AlGaN). However, besides GaN/AlGaN, various combinations of materials for the piezoelectric material 22 and electron donor material 24 may be utilized, for example: GaAs as a piezoelectric material 22 in combination with AlGaAs as an electron donor material 24; InGaAs as a piezoelectric material 22 in combination with InAlAs as an electron donor material 24; and InP as a piezoelectric material 22 in combination with InAlAs as an electron donor material 24. However, due to various performance advantages discussed below GaN/AlGaN are preferred materials for the piezoelectric material 22 and electron donor material 24. Thus it is noted that for discussion purposes the piezoelectric material 22 and electron donor material 24 may be referred to herein as the "gallium nitride layer 22," and "aluminum gallium nitride layer 24," respectively. However, this convention is included for ease of discussion purposes only and is not intended to convey that the layers 22, 24 are limited to those particular materials.

Gallium nitride theoretically retains its piezoelectric properties to well over 900° C. Above temperatures of 900° C., the gallium nitride begins to sublime and lose nitrogen, thereby decomposing and ceasing to function as a piezoelectric material. Aluminum gallium nitride is stable to even higher temperatures (about 1,100° C.). Thus, the use of gallium nitride as the piezoelectric material 22 and aluminum gallium nitride as the electron donor material 24 provides a pressure sensing component 20 having a relatively high operating temperature of at least about 900° C.

A limiting factor in the operating range of the pressure sensor 10 may lie in the materials of the contacts 28. In order to ensure that the pressure sensor 10, as a whole, can withstand high temperatures, the contacts 28 should be made of materials which are stable at high temperatures. Thus, the contacts 28 may be made of titanium, nickel, platinum or gold, all of which are stable at temperatures up to about 400° C. or as high as about 600° C. However the contacts 28 may be made of any metal or series of metals having a sufficiently large enough work function to establish good ohmic contact (i.e. the voltage/current relationship of the contacts 28 should preferably be linear in the range of as high as positive ten volts to as low as negative ten volts, or further preferably over a range of +/−20 volts, or most preferably over range of +/−100 volts depending on operating conditions). Under the current state of knowledge of materials used as contacts 28, thermodynamic and chemical interactions of the contact materials at temperatures above 600° C. may restrict the use of the sensor 10 at temperatures higher than 600° C. Thus, the pressure sensing component 20 and pressure sensor 10 as a whole should be able to withstand temperatures of at least about 400° C., or as high as about 600° C.

Figure 4:
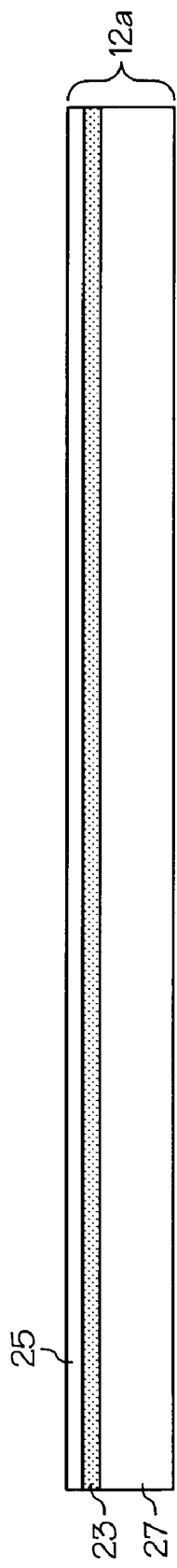
FIGS. 4–6 illustrate a series of steps which may be utilized to make the pressure sensor of FIG. 1.

In order to manufacture the pressure sensor 10 of FIG. 1, an upper substrate portion 12a is first provided (FIG. 4). The upper substrate portion 12a may be made of a variety of materials, such as the materials listed above for the substrate, including but not limited to silicon, aluminum nitride, silicon carbide, sapphire, or a combination of these materials which will support the epitaxial deposition of the gallium nitride layer 22. The upper substrate portion 12a can have any of a variety of thicknesses, preferably at least about 300 microns, or more preferably at least about 500 microns, or most preferably at least about 1000 microns.

The upper substrate portion 12a is preferably made of (111) silicon. Silicon having an (111) orientation is preferred because such (111) silicon has a hexagonal lattice or crystalline structure that matches gallium nitride having a hexagonal lattice structure (also known as a wurtzite lattice structure) and encourages gallium nitride to adhere thereto and epitaxially grow thereon. In contrast, (100) silicon has a cubic lattice structure and therefore gallium nitride having a hexgonal lattice structure cannot be easily grown on (100) silicon.

The upper substrate portion 12a may have an etch stop layer 23 located therein which divides the upper substrate portion 12a into an upper layer or device layer 25 and a lower layer 27. The etch stop layer 23 can include or be made from a variety of materials, including silicon dioxide. Thus the upper substrate portion 12a may be a semiconductor-on-insulator wafer, and more particularly, a silicon-on-insulator wafer which can be acquired from commercial wafer manufacturers.

Alternately, the upper substrate portion 12a can be made of a single monolithic or bulk material which lacks the etch stop layer 23. Further alternately, the upper layer 25 may be made of a different material than the lower layer 27. In this case the upper layer 25 and a lower layer 27 are formed separately but directly bonded together. For example, the lower layer 27 may be made of (100) silicon and the upper layer 25 may be made of (111) silicon. When the upper substrate portion 12a is constructed in this manner the etch stop layer 23 may be omitted, as the junction between the two different types of silicon may provide an effective etch stop, particularly for anisotropic etching. However, if desired one or more of the upper 25 or lower 27 layers may include an etch stop layer, such as silicon dioxide, located thereon before the upper 25 and lower 27 layers are joined together to provide the buried oxide layer 23 to the upper substrate portion 12a.

The gallium nitride 22 is then desired to be deposited onto the upper substrate portion 12a. However, due to differing coefficients of thermal expansion and the difference in lattice constant (distance between adjacent atoms) between silicon and gallium nitride, it may be difficult to directly deposit gallium nitride 22 onto the silicon substrate 12. Thus, a transition layer 36 may be located between the silicon substrate 12 and the gallium nitride 22 layer to allow the gallium nitride 22 to be stably and securely adhered to the substrate 12, and to avoid cracking of the gallium nitride 22 layer after the deposition process.

The transition layer 36 can be nearly any material which allows the gallium nitride 22 (or other material used in place of the gallium nitride 22) to adhere to the substrate 12 and grow epitaxially thereon in a relatively low stress state. For example, the transition layer 36 may be a compositionally-graded layer which has a composition which varies across its thickness to provide strain relief to limit or to prevent formation of cracks in the gallium nitride layer 22. The transition layer 36 may be compositionally graded such that gallium nitride, gallium, or alloys of gallium nitride increase in concentration along the transition layer 36 toward the side of the transition layer 36 which faces the gallium nitride layer 22 (i.e., in the upward direction in FIGS. 1 and 2 or FIG. 5). The remaining portions of the transition layer 36 may be made of the material of the substrate 12, materials which have the same or similar coefficient of thermal expansion and lattice constant as the substrate 12, or other materials which provide strain relief. The use of such a transition layer 36 is disclosed, for example, in U.S. Pat. Nos. 6,611,002 to Weeks et al., U.S. Pat. No. 6,617,060 to Weeks, Jr. et al. and U.S. Pat. No. 6,649,287 to Weeks, Jr. et al. The entire contents of all three of these patents are hereby incorporated by reference.

If desired, instead of or in addition to the compositionally-graded transition layer described above, a layer of silicon carbide can be located between the substrate 12 and the gallium nitride 22. The silicon carbide layer acts as an epitaxial template (i.e. a material having a lattice structure that encourages epitaxial growth thereon) and as a transition layer by reducing lattice mismatch between the gallium nitride 22 and the substrate 12. This silicon carbide layer may be bonded to the substrate 12 or grown as a conversion layer. In addition to the compositionally graded layer and silicon carbide discussed above, the transition layer 36 may be a mixture of nitrides and amorphous films, or various other appropriate materials.

The transition layer 36 is deposited on the upper substrate portion 12a, such as by metal-organic chemical vapor deposition ("MOCVD"), molecular beam epitaxy ("MBE"), plasma enhanced molecular beam epitaxy ("PEMBE"), vapor phase epitaxy, pulsed laser physical vapor deposition, or any other deposition technique known to those skilled in the art. The piezoelectric material 22 and electron donor material 24 are then deposited on the transition layer 36, such as by MOCVD, MBE, PEMBE, vapor phase epitaxy, pulsed laser physical vapor deposition, or any other suitable deposition technique known to those skilled in the art.

Figure 5:
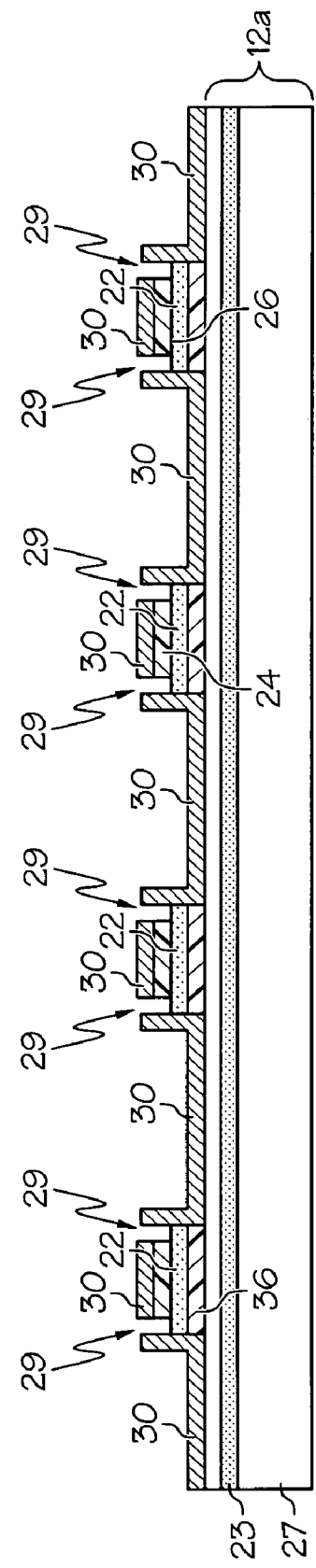

The transition layer 36, piezoelectric material 22 and electron donor material 24 are then patterned into the shapes shown in FIGS. 5 and 3 (or in the serpentine shape described above), using any of the patterning techniques known to those skilled in the art, including without limitation photolithography and reactive ion etching ("RIE"). Alternately, the transition layer 36, piezoelectric material 22, and electron donor material 24 may be deposited in the desired shape, for example, by deposition through a mask.

Next, the passivation layer 30 is deposited over the entire upper surface of the upper substrate portion 12a and the electron donor material 24. After depositing the passivation layer 30, openings 29 are created in the passivation layer 30 (FIG. 5). The openings 29 expose the ends of the piezoelectric material 22. The leads or contacts 28 are then deposited through the openings 29 to form electrical contact with the ends of the sensing components 20 (FIG. 6).

Figure 6:
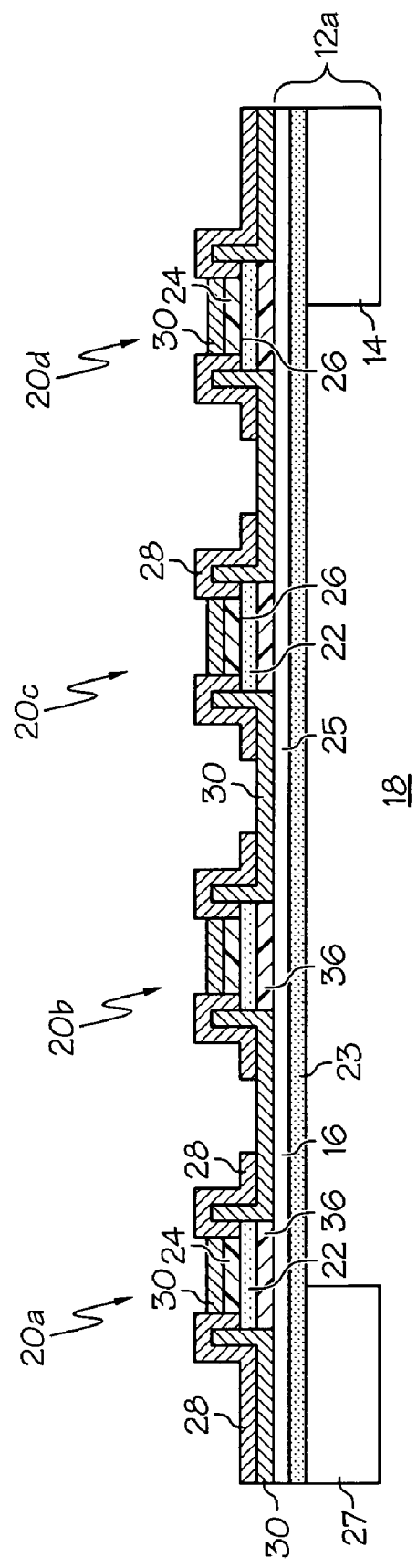

As shown in FIG. 6, the cavity 18 is then formed in the lower portion 27 of the upper substrate portion 12a. The cavity 18 is etched in the upper substrate portion 12a, thereby defining the diaphragm 16 and the base portion 14. The cavity 18 can be formed in a variety of manners, such as wet etching, dry etching (including reactive ion etching and deep reactive ion etching) and the like. If the upper substrate portion 12a includes an etch stop layer 23, the etch stop layer 23 of the upper substrate portion 12a acts as an etch stop during the etching process to provide precise control for the thickness of the diaphragm 16. In this case the etch stop layer 23/upper layer 25 define the thickness of the diaphragm 16. In addition the etch stop layer 23 forms the upper surface of the cavity 18. When the upper substrate portion 12a lacks an etch stop layer 23, the substrate 12 is etched using a timed etch to control the etch depth of cavity 18 and thereby control of thickness of the diaphragm 16.

The cavity 18 should be formed in the upper substrate portion 12a after deposition of the gallium nitride and/or aluminum gallium nitride. In particular, if the cavity 18 were to be formed in the upper substrate portion 12a prior to deposition of the gallium nitride/piezoelectric material 22 and/or the aluminum gallium nitride/electron donor material 24, during the deposition process the upper substrate portion 12a will heat unevenly across its upper surface due to its non-uniform cross section or thickness. The uneven heating can lead to uneven deposition, poor thickness controls, and poor stoichiometry controls of the deposited gallium nitride 22 and/or the aluminum gallium nitride 24. Such poor stoichiometric controls may in turn lead to cracking of the gallium nitride layer 22 and/or aluminum gallium nitride 24 and degraded electronic properties of the sensing components 20. In contrast, if the cavity 18 is not present during deposition of the gallium nitride 22, aluminum gallium nitride 24 and/or other materials, the upper substrate portion 12a has a uniform cross section to eliminate the cause of uneven heating.

After the cavity 18 is formed in the upper substrate portion 12a, the lower substrate portion 12b is provided. It is preferred to make the lower substrate portion 12b of (100) silicon (rather than, for example (111) silicon) because (100) silicon may be more readily available, cheaper and easier to process. For example, (100) silicon can be either anisotropically etched or reactively ion etched, whereas (111) silicon must be etched by reactive ion etching. However, if desired, both the upper substrate portion 12a and lower substrate portion 12b may be made of (111) silicon.

The upper and lower substrate portions 12a, 12b are then coupled together utilizing conventional wafer bonding methods, such as silicon direct fusion bonding, oxide bonding, metal bonding, or other bonding methods well known in the art. At this time the fabrication of the sensor 10 shown in FIG. 1 is complete, and the sensor 10 can be utilized in the manner outlined above.

Figure 7:
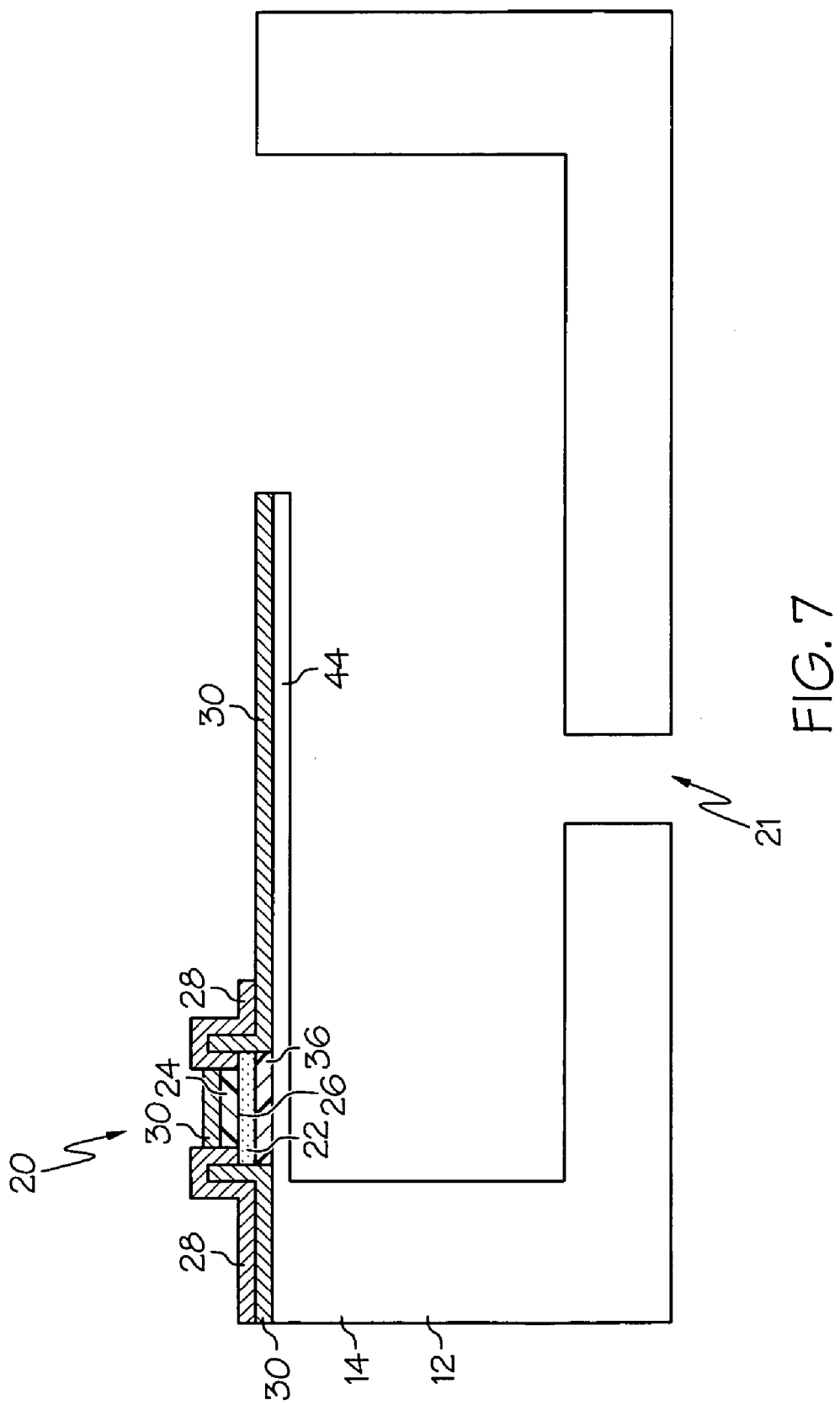
FIG. 7 is a side cross section of another embodiment of the sensor of the present invention.

As shown in FIG. 7, in an alternate embodiment of the invention the sensing component 20 may be located on a cantilever 44, or other movable component, to detect the movement of the movable component. For example, in the embodiment shown in FIG. 7, the sensing component 20 is located at the base of the cantilever 44 and can be used, for example, for sensing dynamic vibrational measurements, or to measure accelerations or to take other physical measurements. Thus, the sensing component 20 of the present invention can be used with nearly any movable component to sense the motion thereof for use in a variety of sensors and actuators.

Having described the invention in detail and by reference to the preferred embodiments, it will be apparent that modifications and variations thereof are possible without departing from the scope of the invention.

What is claimed is:

1. A pressure sensor comprising:
   a movable component that is configured to move when said pressure sensor is exposed to a differential pressure thereacross; and
   a pressure sensing component located on said movable component, wherein said pressure sensing component includes an electrically conductive electron gas which changes its electrical resistance thereacross upon movement of said movable component, wherein said pressure sensor is configured such that leads can be coupled to said pressure sensing component and said pressure sensing component can output a signal via said leads, said signal being related to a pressure to which said pressure sensor is exposed.

2. The pressure sensor of claim 1 wherein said electron gas is a two-dimensional electron gas formed at the interface of two materials.

3. The pressure sensor of claim 2 wherein one of said materials is an electron donor material and the other one of said materials is a piezoelectric material.

4. The pressure sensor of claim 3 wherein said electron donor material is a doped piezoelectric material.

5. The pressure sensor of claim 3 wherein said electron donor material is aluminum gallium nitride and said piezoelectric material is gallium nitride.

6. The pressure sensor of claim 3 wherein said movable component is made of a semiconductor material, a ceramic material, silicon carbide, sapphire or silicon nitride.

7. The pressure sensor of claim 3 wherein said piezoelectric material is located between said movable component and said electron donor material.

8. The pressure sensor of claim 3 wherein said electron donor material has a thickness less than about 500 Angstroms.

9. The pressure sensor of claim 3 wherein said piezoelectric material has a thickness greater than about 0.5 microns.

10. The pressure sensor of claim 3 wherein said piezoelectric material has a thickness greater than about 1 micron.

11. The pressure sensor of claim 1 wherein said movable component is a diaphragm, said pressure sensing component is located on said diaphragm, and said pressure sensor further includes a relatively thick base portion extending around and coupled to said diaphragm such that said diaphragm flexes relative to said base portion when said diaphragm is exposed to a differential pressure thereacross.

12. The pressure sensor of claim 11 wherein said base portion and said diaphragm are made of the same monolithic material.

13. The pressure sensor of claim 11 wherein said base portion is at least partially made of a different material than said diaphragm.

14. The pressure sensor of claim 11 wherein said base portion is a portion of a semiconductor-on-insulator wafer having an internal etch stop layer, and said internal etch stop layer is located on a lower surface of said diaphragm.

15. The pressure sensor of claim 1 wherein said pressure sensing component is made of a different material than said movable component.

16. The pressure sensor of claim 1 further comprising a pair of electrical contacts, each electrical contact being electrically coupled to said pressure sensing component and being spaced apart from each other such that a current can be passed from one electrical contact to the other electrical contact via said electron gas.

17. The pressure sensor of claim 16 wherein each contact is operatively coupled to a processor such that a change in conductivity of said electrically conductive electron gas can be detected by said processor to determine the pressure or change in pressure of a fluid to which said pressure sensor is exposed.

18. The pressure sensor of claim 1 further comprising first, second, and third supplemental pressure sensing components, and wherein said pressure sensing component and said first, second and third supplemental pressure sensing components are arranged in a Wheatstone bridge configuration.

19. The pressure sensor of claim 1 movement of said movable component causes compression or tension in said pressure sensing component.

20. The pressure sensor of claim 1 wherein said pressure sensing component is a generally continuous structure that is substantially free of cracks.

21. The pressure sensor of claim 1 wherein said pressure sensing component has a resistivity of less than about 30 ohm-centimeters in an unstressed condition.

22. The pressure sensor of claim 1 wherein said pressure sensing component can withstand a stress therein of at least about 100 Mpa without cracking when said pressure sensor is exposed to a pressure that strains said pressure sensing component.

23. A sensor comprising:

a movable component; and a sensing component located on said movable component, wherein said sensing component includes an electrically conductive electron gas which changes its electrical resistance thereacross upon movement of said movable component, and wherein said sensor is configured such that leads can be coupled to said sensing component and said sensing component can output a signal via said leads, said signal being related to a movement of said movable component.

* * * * *